United States Patent

Murphy

[11] Patent Number: 5,946,327
[45] Date of Patent: Aug. 31, 1999

[54] METHOD AND APPARATUS FOR CONVERTING BETWEEN A MULTI-BIT TDM BUS AND A SINGLE-BIT TDM BUS USING DIGITAL LOGIC

[75] Inventor: Tim Murphy, Ramona, Calif.

[73] Assignee: 3COM Corporation, Santa Clara, Calif.

[21] Appl. No.: 08/927,372

[22] Filed: Sep. 9, 1997

[51] Int. Cl.[6] ...................................... H04J 3/06
[52] U.S. Cl. .................. 370/517; 370/535; 370/536; 395/891; 341/100; 341/101
[58] Field of Search .................. 370/366, 368, 370/321, 337, 347, 442, 503, 506, 516, 517, 535, 536, 537, 542, 476, 465; 395/885, 891, 310, 308–309; 341/100, 101; 345/29; 365/83, 219; 375/211, 214

[56] References Cited

U.S. PATENT DOCUMENTS

| | | |
|---|---|---|
| 4,377,806 | 3/1983 | Elliott et al. .............................. 341/101 |
| 4,924,464 | 5/1990 | Baylock ................................... 370/535 |
| 5,030,951 | 7/1991 | Eda et al. ................................. 341/101 |
| 5,361,261 | 11/1994 | Edem et al. ............................. 341/102 |
| 5,638,085 | 6/1997 | Hush et al. ................................ 345/74 |
| 5,726,990 | 3/1998 | Shimada et al. ......................... 370/536 |
| 5,818,365 | 10/1998 | Hush et al. .............................. 341/100 |

Primary Examiner—Dang Ton
Assistant Examiner—Seema S. Rao
Attorney, Agent, or Firm—Fish & Richardson P.C.

[57] ABSTRACT

A system and method for converting data between a multi-bit time division multiplexed (TDM) bus and a faster single-bit TDM bus, wherein each TDM bus communicates data by means of frames, each frame comprising a fixed number of slots and each slot comprising a fixed number of bits, the system comprising digital circuitry for establishing a clock rate $R_{SB}$ for the faster single-bit TDM bus that has the following relationship to a clock rate $R_{MB}$ for the multi-bit TDM bus: $R_{SB}=R_{MB}*((\text{slots per frame})*(\text{bits per slot})+1)\div(\text{slots per frame})$.

10 Claims, 5 Drawing Sheets

```
Clock  __|--|__|--|__|--|__|--|__|--|__|--|__|--|__|--|__|--|__|--|__|--|__|--|

Sync   _____|-----|_____|-----|_____

Data   =====|=====|=====|=====|=====|=====|=====|=====|=====|=====|=====|=====|
             |BIT 3|BIT 2|BIT 1|BIT 0|BIT 3|BIT 2|BIT 1|BIT 0|BIT 3|
             |         SLOT 0        |         SLOT 1        |
             |                    TDM FRAME                  |
```

2-slot by 4-bit Single-Bit TDM Frame

FIG. 2

```
Clock  __|--------|_____|--------|_____|--------|_____|--------|

Sync   -----------|_____|-----------------|_____|

D0     ===========|=================|=================|=================|
             |       BIT 0       |       BIT 0       |       BIT 0       |
D1     ===========|=================|=================|=================|
             |       BIT 1       |       BIT 1       |       BIT 1       |
D2     ===========|=================|=================|=================|
             |       BIT 2       |       BIT 2       |       BIT 2       |
D3     ===========|=================|=================|=================|
             |       BIT 3       |       BIT 3       |       BIT 3       |
             |       SLOT 0      |       SLOT 1      |
             |                 TDM FRAME              |
```

Example 2-slot by 4-bit Multi-Bit TDM Frame

FIG. 3

```
S-B-CLK   _|-|_|-|_|-|_|-|_|-|_|-|_|-|_|-|_|-|_|-|_|-|_|-|_|-|_|-|_|-|_|-|_|
FAST_SYNC _|---|                                          |---|
                      <- FAST_SYNC CAN ADJUST ±1 CLOCK PULSE ->
S-B-DATA---|    |___|___|___|___|---|---|---|---|    |___|___|___|___|--
       DATA BIT NOT USED UNLESS SYNC IS ADJUSTED ^
              | B3| B2| B1| B0| B3| B2| B1| B0|
              |     SLOT 0    |    SLOT 1     |
              |            TDM FRAME          |

M-B-CLK    ___|--------|_____|--------|_____|--------|_____|---
SLOW_SYNC  _____|-----------------|_____|-------------
M-B-D3-0              |                 |=======0x0======|=======0xf==
                                        |     SLOT 0     |    SLOT 1     |
                                        |            TDM FRAME           |
```

2-slot by 4-bit Single-Bit to Multi-Bit TDM conversion

FIG. 4

METHOD AND APPARATUS FOR CONVERTING BETWEEN A MULTI-BIT TDM BUS AND A SINGLE-BIT TDM BUS USING DIGITAL LOGIC

BACKGROUND

1. Technical Field

This invention relates to electronic systems, and more particularly to a method and apparatus for converting between a multi-bit time division multiplexed bus and a single-bit time division multiplexed bus.

2. Background Information

Modern electronic systems frequently make use of a backplane (sometimes called a "motherboard") having connectors for multiple plug-in cards (sometimes called "daughterboards"). In FIG. 1 is a block diagram of a backplane based electronic system. Such a system may be used for a computer architecture, a communications processing system, and a wide variety of other electronic systems.

As shown in FIG. 1, a backplane 10 is coupled by a low speed time-division multiplexed (TDM) multiple bit (i.e., parallel or Multi-Bit TDM) bus 12 to several low speed cards 14 and to a high speed card 16. The Multi-Bit TDM bus 12, the backplane 10, and the low speed cards 14 typically operate at a clock rate of about 20 MHz or less (this rate is exemplary only).

The high speed card 16 contains high speed components 18 that may operate, for example, at an internal clock rate in excess of 100 MHz (this rate is exemplary only). Such a rate may be needed, for example, in certain signal processing applications where incoming and outgoing data are inherently serial, such as in digital telephony. A high speed time-division multiplexed single-bit (i.e., serial or Single-Bit TDM) bus 20 is used for internal data communications.

Using a lower speed Multi-Bit TDM bus 12 on the backplane 10 rather then a high speed Single-Bit TDM bus 20 throughout the system allows use of slower, less expensive technology components for the backplane 10 and eliminates a requirement that all cards coupled to the backplane 10 be high speed. Consequently, signals passing between the Multi-Bit TDM bus 12 and the Single-Bit TDM bus 20 must be format converted (serial/parallel) and synchronized by means of a converter interface 22. Conventional designs use a phase lock loop to synchronize the high speed Single-Bit TDM bus 20 with the slower speed Multi-Bit TDM Bus 12.

The inventor has determined that it would be desirable to use a purely digital technique to perform such synchronization. The present invention provides such a technique.

SUMMARY

The invention is a system and method for converting data between a multi-bit time division multiplexed (TDM) bus and a faster single-bit TDM bus, wherein each TDM bus communicates data by means of frames, each frame comprising a fixed number of slots and each slot comprising a fixed number of bits, the system comprising digital circuitry for establishing a clock rate $R_{SB}$ for the faster single-bit TDM bus that has the following relationship to a clock rate $R_{MB}$ for the multi-bit TDM bus: $R_{SB}=R_{MB}*((\text{slots per frame})*(\text{bits per slot})+1) \div (\text{slots per frame})$.

Since data moves from the faster single-bit TDM bus to the slower multi-bit TDM bus, the data must first appear on the faster bus and be translated to the slower bus. In accordance with a preferred embodiment of the invention, a Sync signal on the slower bus is fixed (Slow_Sync). A Sync signal on the Fast bus (Fast_Sync) is modified to precede the Slow_Sync by a selected number of clock cycles. This is done by advancing or delaying the Fast_Sync pulse by up to one clock cycle every frame if required. In the preferred embodiment, this function is accomplished by counting the number of cycles between the Fast_Sync pulse and the Slow_Sync pulse normalized to the clock edge for the slower bus.

Since data moves from the slower Multi-bit TDM bus to the faster Single-bit TDM bus, the data will first appear on the Slow bus and be translated to the Fast bus. In accordance with the invention, the Slow_Sync signal is fixed. Accordingly, the Fast_Sync signal can be easily modified to follow the Slow_Sync signal by a fixed number of clock cycles. This is done without explicitly advancing or delaying the Fast_Sync signal but by directly converting the Slow_Sync into the Fast_Sync.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 2 is a timing diagram showing a 2-slot by 4-bit Single-Bit TDM frame.

FIG. 3 is a timing diagram showing a 2-slot by 4-bit Multi-Bit TDM frame.

FIG. 4 is a timing diagram showing a 2-slot by 4-bit Single-Bit to Multi-Bit TDM conversion in accordance with the present invention.

Like reference numbers and designations in the various drawings indicate like elements.

DETAILED DESCRIPTION

Figure 1:
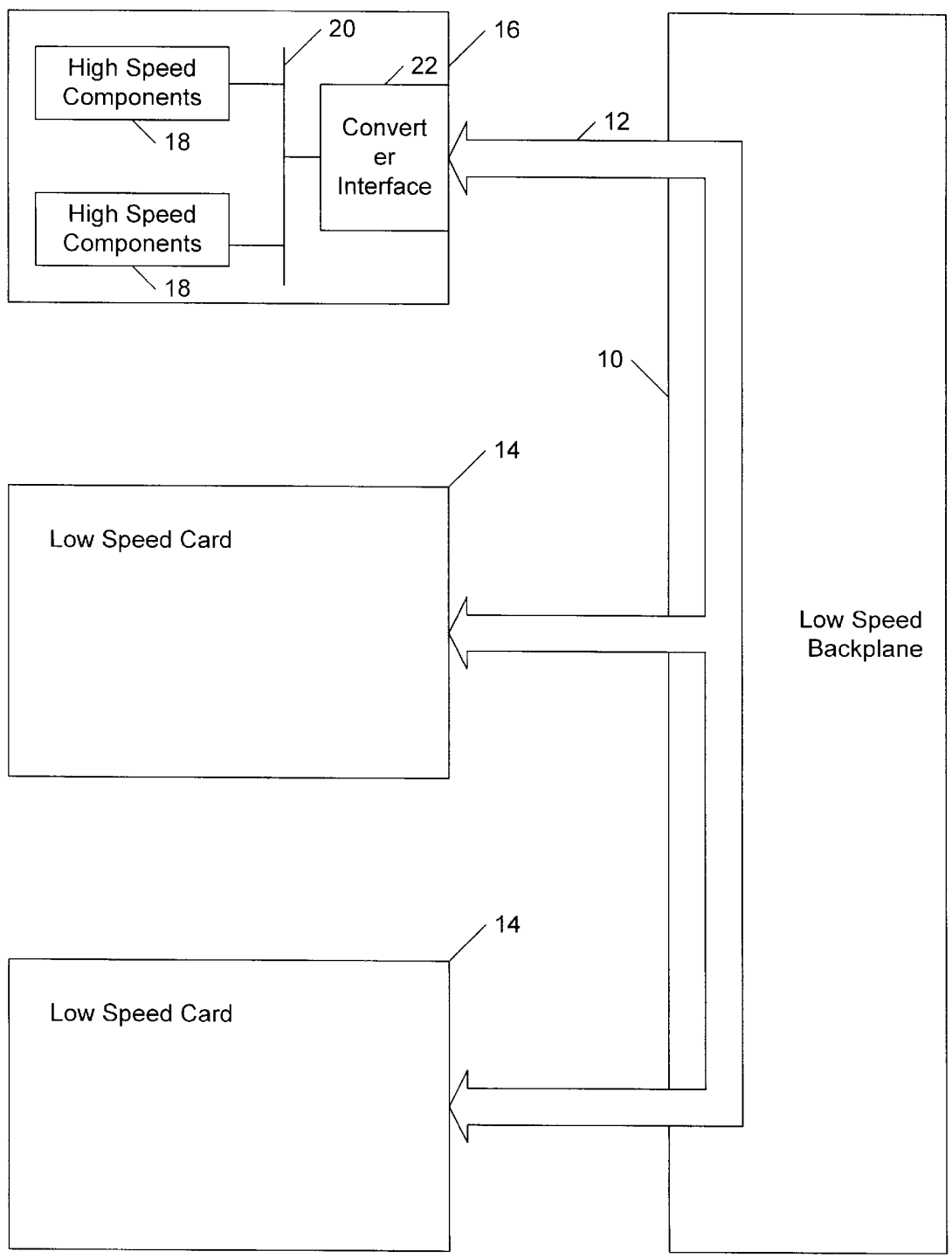
FIG. 1 is a block diagram of a prior art backplane based electronic system.

A time division multiplexed (TDM) bus communicates data by means of frames. Each frame of a TDM bus comprises a fixed number of slots, with each slot comprising a fixed number of bits. A "Sync" signal is used to indicate the beginning of a frame.

FIG. 2 is a timing diagram showing a 2-slot by 4-bit single-bit TDM frame. Slot 0 includes the first four bits of data in the first frame, starting after the Sync signal. Slot 1 includes the last four bits of data in the first frame.

FIG. 3 is a timing diagram showing a 2-slot by 4-bit multi-bit TDM frame. Slot 0 includes the first four bits of data in the first frame, starting after the Sync signal. The bits are carried by four data lines, D0–D3. Slot 1 includes the last four bits of data in the first frame.

Conversion of a multi-bit TDM bus to/from a single-bit TDM bus using purely digital means in accordance with the invention can be accomplished by using a clock rate $R_{SB}$ for the faster single-bit TDM bus that has the following relationship to the clock rate $R_{MB}$ of the slower multi-bit TDM bus:

$R_{SB}=R_{MB}*((\text{slots per frame})*(\text{its per slot})+1)\div(\text{slots per frame})$ Implementation of this relationship has the effect of providing up to one extra clock pulse on the higher speed single-bit TDM bus for every frame. This extra clock pulse provides the flexibility for the single-bit TDM bus to accelerate or delay the Sync signal one clock without dropping data. Synchronization logic digitally locks onto the slower multi-bit TDM bus clock at the beginning of each frame using the Sync signal and free runs for the remainder of each frame. Standard clock oscillators have variances of less than or equal to about 100 parts per million (PPM). Hence, once synchronized, the separate clocks for the single-bit TDM bus and the multi-bit TDM bus will not vary by more than a single clock pulse of the faster single-bit TDM bus during a single frame provided the following holds true:

(frame duration)<(single-bit TDM clock duration)/(summed variance of both oscillators)

For example, if the clock rate $R_{SB}$ for the faster single-bit TDM bus is 50 Mhz with a variance of 100 PPM and the multi-bit TDM clock has a variance of 50 PPM, then:

(Frame Duration)<(1/50 MHz)*(1,000,000/(100+50))=1/(50*15)= 133 µsec

Fast Bus to Slow Bus Conversion

The following describes the logic for conversion from a 2-slot, 4-bit, single-bit to multi-bit TDM bus. The principles of the invention apply to other slots per frame counts and bits per slot counts.

Since data moves from the faster single-bit TDM bus to the slower multi-bit TDM bus, the data must first appear on the faster bus and be translated to the slower bus. In accordance with the invention, the Sync signal on the slower bus is fixed (Slow_Sync). Hence, the Sync signal on the Fast bus (Fast_Sync) is modified to precede the Slow_Sync by a selected number of clock cycles. This is done by advancing or delaying the Fast_Sync pulse by up to one clock cycle every frame if required. In the preferred embodiment, this function is accomplished by counting the number of cycles between the Fast_Sync pulse and the Slow_Sync pulse normalized to the clock edge for the slower bus. The two busses are synchronized if they are separated by a clock cycle count of 3. The Fast_Sync pulse is advanced if the clock cycle count is 2 or less, and delayed if the clock cycle count is 4 or more. If the Slow_Sync pulse is not found by a clock cycle count of 7, then the Fast_Sync pulse is delayed by one clock cycle. This provides a mechanism for the busses to acquire synchronization during initial startup.

The counts given above are for a 2-slot, 4-bit, single-bit to multi-bit TDM bus converter. Other counts may be used for other bus configurations.

FIG. 4 is a timing diagram showing a 2-slot by 4-bit single-bit to multi-bit TDM bus conversion in accordance with the invention. The Fast_Sync pulse for the single-bit (S-B) bus precedes the rising-edge-clocked Slow_Sync pulse of the multi-bit (M-B) bus by between 3 and 4 faster single-bit TDM clock cycles (S-B-CLK), and is synchronized to the slower multi-bit TDM bus. The data (S-B-DATA) for Slot 0 on the faster single-bit TDM bus is all 0's (4 bits long) and is presented on the slower multi-bit TDM bus approximately 5 faster single-bit TDM clock cycles later. The following data for Slot 1 on the faster single-bit TDM bus is all 1's (4 bits long) and is presented on the slower multi-bit TDM bus approximately 5 faster single-bit TDM clock cycles later. The single-bit TDM bus clock cycle that coincides with the Fast_Sync pulse will not carry data when the two busses are synchronized, but will carry data if the Fast_Sync pulse is advanced to maintain synchronization with the slower bus.

Figure 5:
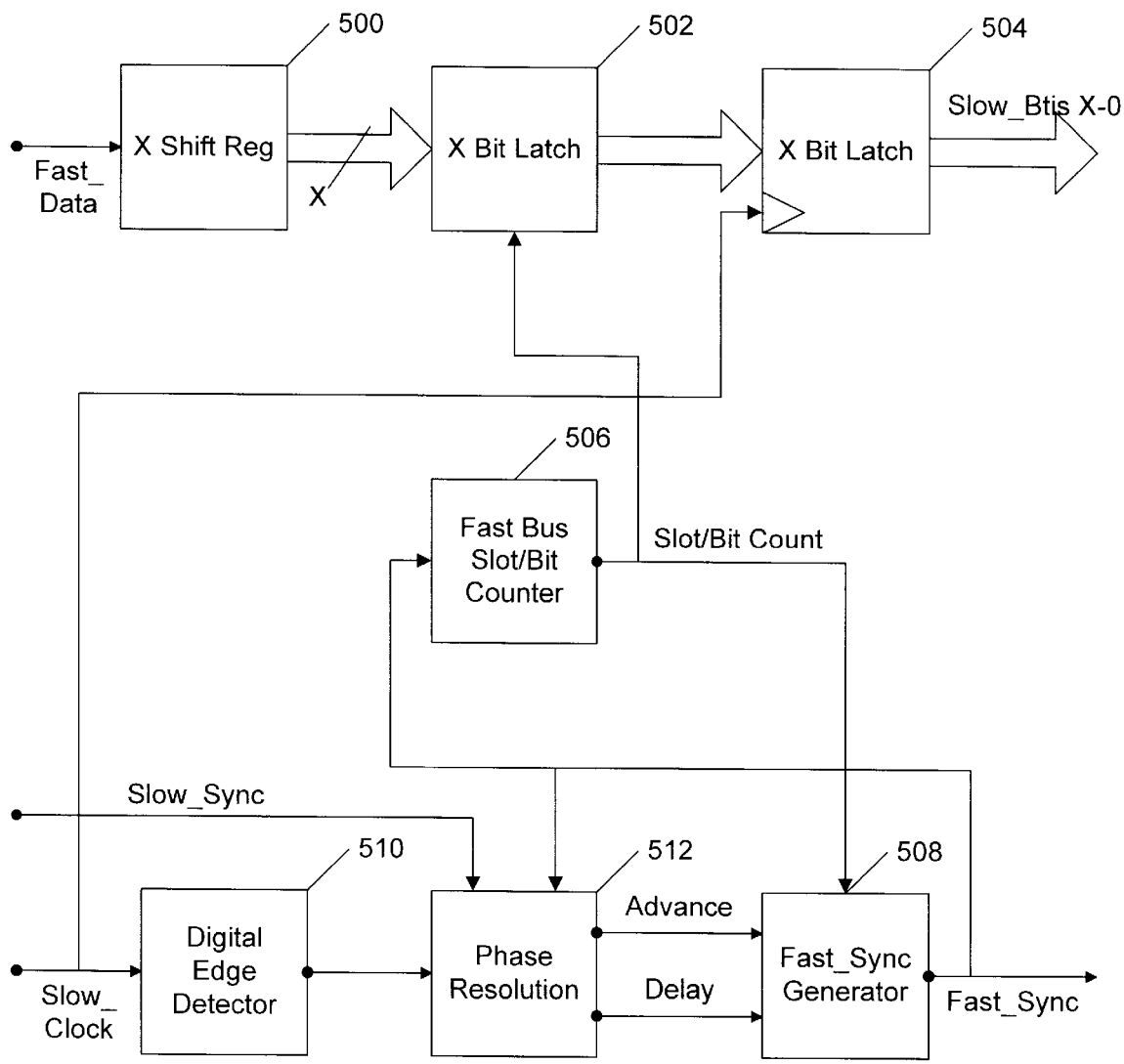
FIG. 5 is a block diagram of one implementation of a Single-Bit to Multi-Bit TDM bus converter in accordance with the invention.

FIG. 5 is a block diagram of one implementation of a single-bit to multi-bit TDM bus converter in accordance with the invention. Unless otherwise specified, all blocks are clocked with the clock from the faster bus (Fast_Clock). Serial data from the faster single-bit TDM bus is coupled to an X-bit wide serial to parallel shift register 500, where "X" is the bit width of the slot of the target multi-bit TDM bus. The output of the parallel shift register 500 is coupled to a synchronization latch 502, which in turn is connected to a buffer latch 504. The buffer latch 504 is clocked by the clock signal from the slower bus (Slow_Clock). The output of the buffer latch 504 are the parallel data bits for a slot on the slower bus.

A fast bus slot/bit counter 506 counts the number of bits per slot on the faster bus, and the number of slots per frame. The output count is used to latch a slot's worth of bits from the shift register 500 into the synchronization latch 502. The output count is also coupled to a Fast_Sync generator 508 which uses the count to determine when to output a Sync signal for the faster bus (i.e., once per frame). The Fast_Sync signal is fed back to the fast bus slot/bit counter 506 to provide start-up synchronization.

The clock from the slower bus (Slow_Clock) is coupled to an edge detector 510, which outputs a signal to a phase resolution circuit 512 when an edge (preferably the falling edge) of the Slow_Clock is detected. Other inputs to the phase resolution circuit 512 include the Sync signal for the slower bus (Slow_Sync), and the Fast_Sync signal. The fast bus slot/bit counter 506 compares the phase of the Slow_Sync and Fast_Sync signals upon each edge detection of the Slow_Clock signal. If the Fast_Sync signal differs from the Slow_Sync signal by 4 or more Fast_Clock cycles, a Delay signal is generated. If the Fast_Sync signal differs from the Slow_Sync signal by 2 or fewer Fast_Clock cycles, an Advance signal is generated. Such determinations are triggered by the output from the edge detector 510. If the Slow_Sync signal is not found by a clock cycle count of 7, then the Fast_Sync signal is delayed by one clock cycle; this provides a mechanism for the busses to acquire synchronization during initial startup.

Slow Bus to Fast Bus Conversion

The following describes the logic for conversion from a 2-slot, 4-bit, multi-bit to single-bit TDM bus. Again, the principles of the invention apply to other slots per frame counts and bits per slot counts.

Since data moves from the slower multi-bit TDM bus to the faster single-bit TDM bus, the data will first appear on the Slow bus and be translated to the Fast bus. In accordance with the invention, the Slow_Sync signal is fixed. Accordingly, the Fast_Sync signal can be modified easily to follow the Slow_Sync signal by a fixed number of clock cycles. This is done without explicitly advancing or delaying the Fast_Sync signal but by directly converting the Slow_Sync into the Fast_Sync.

Figure 6:
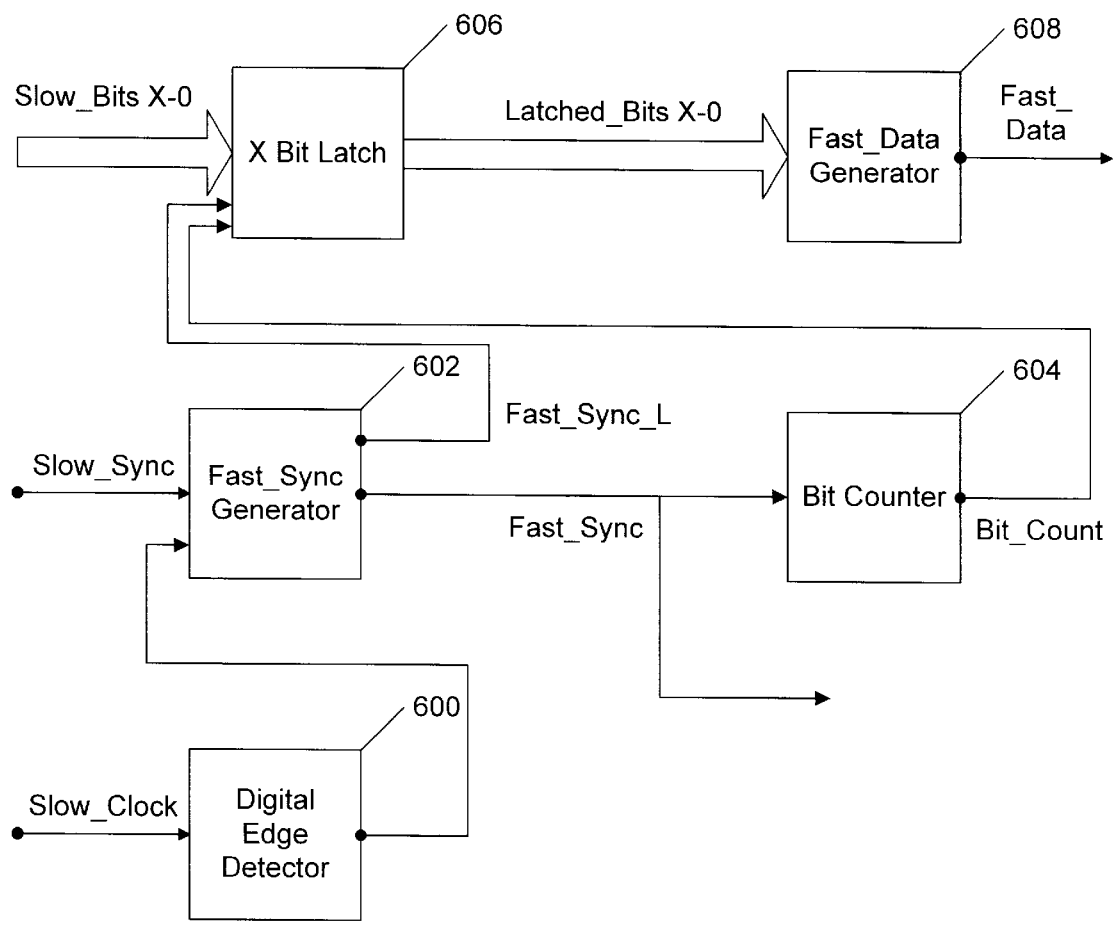
FIG. 6 is a block diagram of one implementation of a Multi-Bit to Single-Bit TDM bus converter in accordance with the invention.

FIG. 6 is a block diagram of one implementation of a multi-bit to single-bit TDM bus converter in accordance with the invention. Unless otherwise specified, all blocks are clocked by the Fast_Clock signal. The Slow_Clock signal is coupled to an edge detector 600, which outputs a signal to a Fast_Sync generator 602 when an edge (preferably the falling edge) of the Slow_Clock is detected. Another input to the Fast_Sync generator 602 is the Slow_Sync signal. The Fast_Sync generator 602 outputs a Fast_Sync signal in response to the output of the edge detector 600, and offset from the Slow_Sync signal by a fixed number of clock cycles. For conversion from a 2-slot, 4-bit, multi-bit to single-bit TDM bus, the offset is one clock cycle.

The Fast_Sync signal triggers a bit counter 604, which provides a count of the number of bits per slot on the slower bus. The data bits from the slower bus are coupled to an X-bit wide buffer latch 606, which is clocked by the output from the bit counter 604. The inverse Fast_Sync signal, Fast_Sync_L, enables the buffer latch 606. The latched data bits are coupled to a fast data generator 608, which is essentially a parallel to serial shift register.

Programmable Logic Implementation

Following is the program code for one implementation of the invention using a programmable logic device such as Part No. ispLSI1016-110LJ from Lattice Semiconductor Corp. The implementation is of a 4-bit, 2-slot multi-bit/ single-bit TDM converter using the concepts discussed above. This design has been compiled and simulated, and was implemented using Boolean logic. The programming language is the ABEL language. The invention may be implemented in other ways, such as in discrete digital logic, an application specific integrated circuit (ASIC), or fast programmed processor.

```
"This is an example design for the conversion between a 2 slot, 4 data line, slow speed
"TDM bus and a 2 slot, 4 bits per slot, single bit high speed TDM bus. It is assumed
"that the RX and TX portions of the TDM bus use different sync signals but a common clock.
"It is also assumed that the Slow bus is a backplane bus with a fixed Sync signal and
"that the Sync signal on the Fast bus is controlled by the conversion logic.
module tdm_conv
"Inputs from High Speed TDM bus
reset            pin;
fast_clock       pin;
fast_rx_data     pin;
rs    = [reset];
fc    = [fast_clock];
frd   = [fast_rx_data];
"Outputs to High Speed TDM bus
fast_tx_sync   pin istype 'reg';
fast_rx_sync   pin istype 'reg';
fast_tx_data   pin istype 'reg';
fts   = [fast_tx_sync];
frs   = [fast_rx_sync];
ftd   = [fast_tx_data];
"Inputs from Low Speed TDM bus
slow_clock        pin;
slow_tx_sync      pin;
slow_rx_sync      pin;
slow_rx_bit0      pin;
slow_rx_bit1      pin;
slow_rx_bit2      pin;
slow_rx_bit3      pin;
sc    = [slow_clock];
sts   = [slow_tx_sync];
srs   = [slow_rx_sync];
srd   = [slow_rx_bit3, slow_rx_bit2, slow_rx_bit1, slow_rx_bit0];
"Outputs to Low Speed TDM bus
slow_tx_bit0 pin istype 'reg';
slow_tx_bit1 pin istype 'reg';
slow_tx_bit2 pin istype 'reg';
slow_tx_bit3 pin istype 'reg';
std = [slow_tx_bit3, slow_tx_bit2, slow_tx_bit1, slow_tx_bit0];
"Logic common to both Fast RX to Slow TX and Slow TX to Fast RX
slow_clock_10        node istype 'reg';
slow_clock_11        node istype 'reg';
slow_clock_edge      node istype 'reg';
sce = [slow_clock_edge];
"Logic required for Fast RX to Slow TX TDM conversion
fast_rx_sync_cnt0       node istype 'reg';
fast_rx_sync_cnt1       node istype 'reg';
fast_rx_sync_cnt2       node istype 'reg';
fast_rx_sync_count      node istype 'reg';
fast_rx_sync_delay      node istype 'reg';
fast_rx_sync_advnc      node istype 'reg';
fast_rx_data_10         node istype 'reg';
fast_rx_data_11         node istype 'reg';
fast_rx_data_12         node istype 'reg';
fast_rx_data_13         node istype 'reg';
fast_rx_bit0_1          node istype 'reg';
fast_rx_bit1_1          node istype 'reg';
fast_rx_bit2_1          node istype 'reg';
fast_rx_bit3_1          node istype 'reg';
fast_rx_bit_cnt0        node istype 'reg';
fast_rx_bit_cnt1        node istype 'reg';
fast_rx_slot_cnt0       node istype 'reg';
frscn  = [fast_rx_sync_cnt2, fast_rx_sync_cnt1, fast_rx_sync_cnt0];
frsc   = [fast_rx_sync_count];
frsd   = [fast_rx_sync_delay];
```

```
frsa    = [fast_rx_sync_advnc];
frd0    = [fast_rx_data_10];
frd1    = [fast_rx_data_11];
frd2    = [fast_rx_data_12];
frd3    = [fast_rx_data_13];
frb     = [fast_rx_bit3_1, fast_rx_bit2_1, fast_rx_bit1_1, fast_rx_bit0_1];
frbc    = [fast_rx_bit_cnt1, fast_rx_bit_cnt0];
fr1c    = [fast_rx_slot_cnt0];
```
"Logic required for Slow RX to Fast TX TDM conversion
```
slow_rx_sync_1          node istype 'reg';
fast_tx_bit_cnt0        node istype 'reg';
fast_tx_bit_cnt1        node istype 'reg';
fast_tx_sync_1          node istype 'reg';
slow_rx_bit0_1          node istype 'reg';
slow_rx_bit1_1          node istype 'reg';
slow_rx_bit2_1          node istype 'reg';
slow_rx_bit3_1          node istype 'reg';
srs1    = [slow_rx_sync_1];
ftbc    = [fast_tx_bit_cnt1, fast_tx_bit_cnt0];
fts1    = [fast_tx_sync_1];
srb1    = [slow_rx_bit3_1, slow_rx_bit2_1, slow_rx_bit1_1, slow_rx_bit0_1];
x       = .X.;
equations
```
"**********************************************************************
"The following provides the logic used for both the Fast RX to Slow TX
"and Slow RX to Fast TX TDM busses
"**********************************************************************
"synchronize to the slow clock edges
```
slow_clock_10           := slow_clock & !reset;
slow_clock_10.clk       = !fast_clock;
slow_clock_11           := slow_clock_10 & !reset;
slow_clock_11.clk       = !fast_clock;
```
"Synchronizing to the falling edge plus ½ slot time
"(2 clocks) which is the rising edge of the clock.
```
slow_clock_edge         := !slow_clock_10 & slow_clock_11 & !reset;
slow_clock_edge.clk     = !fast_clock;
```
"**********************************************************************
"The following provides the logic for the conversion from a 2-slot,
"4 bit, single-bit to multi-bit TDM bus.
"
"Since the data moves from the Single-bit Fast bus to the Multi-bit
"Slow bus, the data must first appear on the Fast bus and be translated
"to the Slow bus. Since the Sync on the Slow bus is fixed, the Sync on the
"Fast bus must be modified to precede that of the Slow bus by the proper
"number of clock cycles. This is done by advancing or delaying the Fast Sync
"pulse one clock cycle every frame if required. This is accomplished by
"counting the number of cycles between the Fast Sync pulse and the Slow Sync
"pulse normalized to the Slow clock edge. The busses are synchronized if
"they are separated by a count of 3. Fast Sync is advanced if the count is
"2 or less, and delayed if count is 4 or more. If the Slow Sync pulse is
"not found by a count of 7, then the Fast pulse is delayed by one. This
"provides a mechanism for the busses to acquire synchronization during
"initial startup.
"**********************************************************************
"Count clocks from Fast Sync to Slow Sync, resets to 0 on !fast_rx_sync_count
```
fast_rx_sync_cnt0 := fast_rx_sync_count
        & !fast_rx_sync_cnt0 & !reset;
fast_rx_sync_cnt0.clk = !fast_clock;
fast_rx_sync_cnt1 := fast_rx_sync_count
        & !fast_rx_sync_cnt0 & fast_rx_sync_cnt1 & !reset
        # fast_rx_sync_count
        & fast_rx_sync_cnt0 & !fast_rx_sync_cnt1 & !reset;
fast_rx_sync_cnt1.clk = !fast_clock;
fast_rx_sync_cnt2 := fast_rx_sync_count
        & fast_rx_sync_cnt0 & fast_rx_sync_cnt1 & !fast_rx_sync_cnt2 & !reset
        # fast_rx_sync_count
        & !fast_rx_sync_cnt0 & fast_rx_sync_cnt2 & !reset
        # fast_rx_sync_count
        & !fast_rx_sync_cnt1 & fast_rx_sync_cnt2 & !reset;
fast_rx_sync_cnt2.clk = !fast_clock;
```
"Count from Fast Sync to Slow Sync clock edge or if sync counter goes to 7
```
fast_rx_sync_count := fast_rx_sync & !reset
# !slow_clock_edge & !fast_rx_sync_cnt0 & fast_rx_sync_count & !reset
# !slow_clock_edge & !fast_rx_sync_cnt1 & fast_rx_sync_count & !reset
# !slow_clock_edge & !fast_rx_sync_cnt2 & fast_rx_sync_count & !reset
# !slow_tx_sync & !fast_rx_sync_cnt0 & fast_rx_sync_count & !reset
# !slow_tx_sync & !fast_rx_sync_cnt1 & fast_rx_sync_count & !reset
# !slow_tx_sync & !fast_rx_sync_cnt2 & fast_rx_sync_count & !reset;
fast_rx_sync_count.clk = !fast_clock;
```
"Advance next Fast Sync if 2 or less Fast clock between Syncs and stay active -continued "Until Slot cnt = 1 and bit cnt = 2
fast_rx_sync_advnc := fast_rx_sync_count & slow_clock_edge & slow_tx_sync
    & !fast_rx_sync_cnt0 & !fast_rx_sync_cnt2 & !reset
    # fast_rx_sync_count & slow_clock_edge & slow_tx_sync
    & !fast_rx_sync_cnt1 & !fast_rx_sync_cnt2 & !reset
    # !fast_rx_sync_advnc & !fast_rx_slot_cnt0 & !reset
    # fast_rx_sync_advnc & !fast_rx_bit_cnt1 & !reset
    # fast_rx_sync_advnc & fast_rx_bit_cnt0 & !reset;
fast_rx_sync_advnc.clk = !fast_clock;
"Delay next Fast Sync if 4 or more Fast clocks between Syncs and stay active
"Until Slot cnt = 0 and bit cnt = 0
fast_rx_sync_delay := fast_rx_sync_count & slow_clock_edge & slow_tx_sync
    & fast_rx_sync_cnt2 & !reset
    # fast_rx_sync_delay & fast_rx_slot_cnt0 & !reset
    # fast_rx_sync_delay & fast_rx_bit_cnt1 & !reset
    # fast_rx_sync_delay & fast_rx_bit_cnt0 & !reset;
fast_rx_sync_delay.clk = !fast_clock;
"Count Bits per slot, resets to 0 on fast_rx_sync
fast_rx_bit_cnt0 := !fast_rx_sync & !fast_rx_bit_cnt0 & !reset;
fast_rx_bit_cnt0.clk = !fast_clock;
fast_rx_bit_cnt1 := !fast_rx_sync & fast_rx_bit cnt0 & !fast rx bit cnt1 & !reset
    # !fast_rx_sync & !fast_rx_bit_cnt0 & fast_rx_bit_cnt1 & !reset;
fast_rx_bit_cnt1.clk = !fast_clock;
"Count Slots, resets to 0 on fast_rx_sync
fast_rx_slot_cnt0 := !fast_rx_sync & !fast_rx_slot_cnt0
    & fast_rx_bit_cnt0 & fast_rx_bit_cnt1 & !reset
    # !fast_rx_sync & fast_rx_slot_cnt0 & !fast_rx_bit_cnt0 & !reset
    # !fast_rx_sync & fast_rx_slot_cnt0 & !fast_rx_bit_cnt1 & !reset;
fast_rx_slot_cnt0.clk = !fast clock;
    "Generate Fast Sync signal
"if in sync then generate on       Slot = 1, Bits = 3
"if delay set then generate on     Slot = 0, Bits = 0
"if advance set then generate on   Slot = 1, Bits = 2
fast_rx_sync := !fast_rx_sync_delay & !fast_rx_sync_advnc & !fast_rx_sync
    & fast_rx_slot_cnt0 & fast_rx_bit_cnt1 & fast_rx_bit_cnt0 & !reset
    # fast_rx_sync_delay & !fast_rx_sync
    & !fast_rx_slot_cnt0 & !fast_rx_bit_cnt1 & !fast_rx_bit_cnt0 & !reset
    # fast_rx_sync_advnc & !fast_rx_sync
    & fast_rx_slot_cnt0 & fast_rx_bit_cnt1 & !fast_rx bit cnt0 & !reset;
fast_rx_sync.clk = !fast_clock;
"Latch Fast data through bit shifter
fast_rx_data 10          := fast_rx_data & !reset;
fast_rx_data_10.clk      = fast_clock;
fast_rx_data_11          := fast_rx_data_10 & !reset;
fast_rx_data_11.clk      = fast_clock;
fast_rx_data_12          := fast_rx_data_11 & !reset;
fast_rx_data_12.clk      = fast_clock;
fast_rx_data_13          := fast_rx_data_12 & !reset;
fast_rx_data_13.clk      = fast_clock;
"Latch Fast data from bit shifter to temporary holding register on the bit
"count of 3
fast_rx_bit0_1 := fast_rx_bit_cnt1 & fast_rx_bit_cnt0 & fast_rx_data 10 & !reset
    # !fast_rx_bit_cnt1 & fast_rx_bit0_1 & !reset
    # !fast_rx_bit_cnt0 & fast_rx_bit0_1 & !reset;
fast_rx_bit0_1.clk = !fast clock;
fast_rx_bit1_1 := fast_rx_bit_cnt1 & fast_rx_bit_cnt0 & fast_rx_data_11 & !reset
    # !fast_rx_bit_cnt1 & fast_rx_bit1_1 & !reset
    # !fast_rx_bit_cnt0 & fast_rx_bit1_1 & !reset;
fast_rx_bitl_1.clk = !fast_clock;
fast_rx_bit2_1 := fast_rx_bit cnt1 & fast rx bit_cnt0 & fast_rx_data 12 & !reset
    # !fast_rx_bit_cnt1 & fast_rx_bit2_1 & !reset
    # !fast_rx_bit_cnt0 & fast_rx_bit2_1 & !reset;
fast_rx_bit2_1.clk = !fast_clock;
fast_rx_bit3_1 := fast_rx_bit_cnt1 & fast rx bit_cnt0 & fast_rx_data 13 & !reset
    # !fast_rx_bit_cnt1 & fast_rx_bit3_1 & !reset
    # !fast_rx_bit_cnt0 & fast_rx_bit3_1 & !reset;
fast_rx_bit3_1.clk = !fast_clock;
"Latch Fast Data from temporary register to Slow bus
slow_tx_bit0           := fast_rx_bit0_1 & !reset;
slow_tx_bit0.clk       = !slow_clock;
slow_tx_bit1           := fast_rx_bit1_1 & !reset;
slow_tx_bit1.clk       = !slow_clock;
slow_tx_bit2           := fast_rx_bit2_1 & !reset;
slow_tx_bit2.clk       = !slow_clock;
slow_tx_bit3           := fast_rx_bit3_1 & !reset;
slow_tx_bit3.clk       = !slow_clock;
"*****************************************************************
"The following provides the logic for the conversion from a 2-slot,
"4 bit, multi-bit to single-bit TDM bus.
"

-continued

"Since the data moves from the Multi-bit Slow bus to the Single-bit
"Fast bus, the data will first appear on the Slow bus and be translated
"to the Fast bus. Since the Sync on the Slow bus is fixed, the Sync on the
"Fast bus can be easily modified to follow that of the Slow bus by a fixed
"number of clock cycles. This is done without explicitly advancing or
"delaying the Fast Sync signal but by directly converting the Slow Sync
"into the Fast Sync.
"*********************************************************************
"Latch the Slow RX data Bits in the middle of the bit cell which starts as
"slow_clock_edge & slow_rx_sync delayed one clock for the first slot time
"and samples at bit count = 3 for the rest of the frame
slow_rx bit0_1 := fast_tx_sync_1 & slow_rx bit0 & !reset
    # fast_tx_bit_cnt1 & fast_tx_bit_cnt0 & slow rx bit0 & !reset
    # !fast_tx_sync_1 & !fast_tx_bit_cnt0 & slow_rx_bit0 & !reset
    # !fast_tx_sync_1 & !fast_tx_bit_cnt1 & slow_rx_bit0 & !reset;
slow_rx_bit0_1.clk = !fast_clock;
slow_rx bit1_1 := fast_tx_sync_1 & slow_rx bit1 & !reset
    # fast_tx_bit_cnt1 & fast_tx_bit_cnt0 & slow_rx_bit1 & !reset
    # !fast_tx_sync_1 & !fast_tx_bit_cnt0 & slow_rx_bit1_1 & !reset
    # !fast_tx_sync_1 & !fast_tx_bit_cnt1 & slow_rx_bit1_1 & !reset;
slow_rx_bit1_1.clk = !fast_clock;
slow_rx_bit2_1 := fast_tx_sync_1 & slow_rx_bit2 & !reset
    # fast_tx_bit_cnt1 & fast_tx_bit_cnt0 & slow_rx_bit2 & !reset
    # !fast_tx_sync_1 & !fast_tx_bit_cnt0 & slow_rx_bit2_1 & !reset
    # !fast_tx_sync_1 & !fast_tx_bit_cnt1 & slow_rx_bit2_1 & !reset;
slow_rx_bit2_1.clk = !fast_clock;
slow_rx_bit3_1 := fast_tx_sync_1 & slow_rx bit3 & !reset
    # fast_tx_bit_cnt1 & fast_tx_bit_cnt0 & slow_rx_bit3 & !reset
    # !fast_tx_sync_1 & !fast_tx_bit_cnt0 & slow_rx_bit3_1 & !reset
    # !fast_tx_sync_1 & !fast_tx_bit_cnt1 & slow_rx_bit3_1 & !reset;
slow_rx_bit3_1.clk = !fast_clock;
"Latch the Slow Sync signal
slow_rx_sync_1 := slow_clock_edge & slow_rx_sync & !reset
    # !slow_clock_edge & slow_rx_sync_1 & !reset;
slow_rx_sync_1.clk = !fast_clock;
"Keep a counter for which bit is being sent on the Fast TDM bus,
"resets on fast_tx_sync_1
fast_tx_bit_cnt0 := !fast_tx_sync_1 & !fast_tx_bit_cnt0 & !reset;
fast_tx_bit_cnt0.clk = !fast_clock;
fast_tx_bit_cnt1 := !fast_tx_sync_1 & fast_tx_bit_cnt0 & !fast_tx_bit_cnt1 & !reset
    # !fast_tx_sync_1 & !fast_tx_bit_cnt0 & fast_tx_bit_cnt1 & !reset;
fast_tx_bit_cnt1.clk = !fast_clock;
"Generate the Fast Sync Signal & delay it by one relative to slow_clock_edge
fast_tx_sync_1 := slow_clock_edge & slow_rx_sync_1 & !reset;
fast_tx_sync_1.clk = !fast_clock;
fast_tx_sync := fast_tx_sync_1 & !reset;
fast_tx_sync.clk = !fast_clock;
"Generate the Fast TDM Data
fast_tx_data := !fast tx bit cnt0 & !fast_tx_bit_cnt0 & slow_rx_bit3_1 & !reset
    # fast_tx_bit_cnt0 & !fast_tx_bit_cnt0 & slow_rx_bit2_1 & !reset
    # !fast_tx_bit_cnt0 & fast_tx_bit_cnt0 & slow_rx_bit1_1 & !reset
    # fast_tx_bit_cnt0 & fast_tx_bit cnt0 & slow_rx_bit0_1 & !reset;
fast_tx_data.clk = !fast_clock;
end A number of embodiments of the present invention have been described. Nevertheless, it will be understood that various modifications may be made without departing from the spirit and scope of the invention. For example, since the multi-bit bus can have any number of data lines from 1 to n, the invention will also work in synchronizing two single bit busses. Accordingly, other embodiments are within the scope of the following claims.

What is claimed is:

1. A system for converting data between a multi-bit time division multiplexed bus and a faster single-bit time division multiplexed bus, wherein each time division multiplexed bus communicates data by means of frames, each frame comprising a fixed number of slots and each slot comprising a fixed number of bits, the system including digital circuitry for establishing a clock rate $R_{SB}$ for the faster single-bit time division multiplexed bus that has the following relationship to a clock rate $R_{MB}$ for the multi-bit time division multiplexed bus:

$$R_{SB}=R_{MB}*((\text{slots per frame})*(\text{bits per slot})+1)\div(\text{slots per frame}).$$

2. A system for converting data from a single-bit time division multiplexed bus to a slower multi-bit time division multiplexed bus, wherein each bus communicates data by means of frames, each frame comprising a fixed number of slots and each slot comprising a fixed number of bits, each bus having a Sync signal indicating the beginning of each frame and a clock signal, the system comprising:
   (a) a phase resolution circuit, coupled to the Sync signal of each bus and to the clock signal of the multi-bit bus, for determining a phase relationship between the Sync signal of the single-bit bus and the Sync signal of the multi-bit bus relative to the clock signal of the multi-bit bus, and outputting a phase signal indicative of such determination;
   (b) a synchronization generator, coupled to the output of the phase resolution circuit, for generating an advanced or delayed Sync signal for the single-bit bus in response to the phase signal; and
   (c) single-bit to multi-bit conversion and buffering circuitry, coupled to the data from the single-bit bus, the advanced or delayed Sync signal for the single-bit bus, and the clock signal of the multi-bit bus, for converting data from the single-bit bus to the multi-bit bus in synchronization with the clock signal of the multi-bit bus and the advanced or delayed Sync signal for the single-bit bus.

3. The system claim of 2, wherein the phase signal output of the phase resolution circuit is indicative of the number of cycles between the Sync signal for the single-bit bus and the Sync signal for the multi-bit bus.

4. The system claim of 2, wherein the rate of the clock signal, $R_{SB}$, for the single-bit bus has the following relationship to the rate of the clock signal, $R_{MB}$ for the multi-bit bus:

$$R_{SB}=R_{MB}*((\text{slots per frame})*(\text{bits per slot})+1)\div(\text{slots per frame}).$$

5. A system for converting data from a multi-bit time division multiplexed bus to a faster single-bit time division multiplexed bus, wherein each bus communicates data by means of frames, each frame comprising a fixed number of slots and each slot comprising a fixed number of bits, each bus having a Sync signal indicating the beginning of each frame and a clock signal, the system comprising:

(a) an edge detector circuit for detecting a triggering edge of the clock signal of the multi-bit bus;

(b) a synchronization generator, coupled to the output of the edge detector circuit and to the Sync signal of the multi-bit bus, for generating a delayed Sync signal for the single-bit bus in response to the output signal of the edge detector circuit and in delayed synchronization with the Sync signal of the multi-bit bus; and (c) multi-bit to single-bit conversion and buffering circuitry, coupled to the data from the multi-bit bus and the delayed Sync signal for the single-bit bus, for converting data from the multi-bit bus to the single-bit bus in synchronization with the delayed Sync signal for the single-bit bus.

6. A method for converting data between a multi-bit time division multiplexed bus and a faster single-bit time division multiplexed bus, wherein each time division multiplexed bus communicates data by means of frames, each frame comprising a fixed number of slots and each slot comprising a fixed number of bits, including the step of establishing a clock rate $R_{SB}$ for the faster single-bit time division multiplexed bus that has the following relationship to a clock rate $R_{MB}$ for the multi-bit time division multiplexed bus:

$$R_{SB}=R_{MB}*((\text{slots per frame})*(\text{bits per slot})+1)\div(\text{slots per frame}).$$

7. A method for converting data from a single-bit time division multiplexed bus to a slower multi-bit time division multiplexed bus, wherein each bus communicates data by means of frames, each frame comprising a fixed number of slots and each slot comprising a fixed number of bits, each bus having a Sync signal indicating the beginning of each frame and a clock signal, the method comprising the steps of:

(a) determining a phase relationship between the Sync signal of the single-bit bus and the Sync signal of the multi-bit bus relative to the clock signal of the multi-bit bus, and outputting a phase signal indicative of such determination;

(b) generating an advanced or delayed Sync signal for the single-bit bus in response to the phase signal; and (c) converting data from the single-bit bus to the multi-bit bus in synchronization with the clock signal of the multi-bit bus and the advanced or delayed Sync signal for the single-bit bus.

8. The method claim of 7, wherein the phase signal is indicative of the number of cycles between the Sync signal for the single-bit bus and the Sync signal for the multi-bit bus.

9. The method claim of 7, wherein the rate of the clock signal, $R_{SB}$, for the single-bit bus has the following relationship to the rate of the clock signal, $R_{MB}$, for the multi-bit bus:

$$R_{SB}=R_{MB}*((\text{slots per frame})*(\text{bits per slot})+1)\div(\text{slots per frame}).$$

10. A method for converting data from a multi-bit time division multiplexed bus to a faster single-bit time division multiplexed bus, wherein each bus communicates data by means of frames, each frame comprising a fixed number of slots and each slot comprising a fixed number of bits, each bus having a Sync signal indicating the beginning of each frame and a clock signal, the method comprising the steps of:

(a) detecting a triggering edge of the clock signal of the multi-bit bus;

(b) generating a delayed Sync signal for the single-bit bus in response to the detected triggering edge and in delayed synchronization with the Sync signal of the multi-bit bus; and (c) converting data from the multi-bit bus to the single-bit bus in synchronization with the delayed Sync signal for the single-bit bus.

\* \* \* \* \*